United States Patent
Takahashi et al.

(10) Patent No.: US 7,463,032 B2
(45) Date of Patent: Dec. 9, 2008

(54) NMR SPECTROMETER AND METHOD OF NMR MEASUREMENT

(75) Inventors: Yutaka Takahashi, Tokyo (JP); Satoshi Sakurai, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 11/782,235

(22) Filed: Jul. 24, 2007

(65) Prior Publication Data

US 2008/0150534 A1 Jun. 26, 2008

(30) Foreign Application Priority Data

Jul. 24, 2006 (JP) .............................. 2006-200240
May 30, 2007 (JP) .............................. 2007-143280

(51) Int. Cl.
 *G01V 3/00* (2006.01)
(52) U.S. Cl. ...................................... 324/321; 324/318
(58) Field of Classification Search ......... 324/300–322; 600/407–449
See application file for complete search history.

(56) References Cited

U.S. PATENT DOCUMENTS

| | | | | |
|---|---|---|---|---|
| 5,397,989 | A * | 3/1995 | Spraul et al. ................. | 324/321 |
| 7,129,091 | B2 * | 10/2006 | Ismagilov et al. ............. | 436/34 |
| 7,138,254 | B2 * | 11/2006 | Jovanovich et al. ........ | 435/91.2 |
| 2008/0057505 | A1 * | 3/2008 | Lin et al. ........................ | 435/6 |
| 2008/0146896 | A1 * | 6/2008 | Rabinowitz et al. ......... | 600/309 |
| 2008/0160634 | A1 * | 7/2008 | Su et al. ...................... | 436/501 |

FOREIGN PATENT DOCUMENTS

| | | |
|---|---|---|
| JP | 57-75558 | 5/1982 |
| JP | 2004-502547 | 4/2004 |

* cited by examiner

*Primary Examiner*—Brij B Shrivastav
(74) *Attorney, Agent, or Firm*—The Webb Law Firm

(57) ABSTRACT

There is disclosed a microchip reactor-type apparatus for effecting organic synthesis and reactions. The apparatus can be used in combination with many analytical instruments. The apparatus has a magnet for producing a static magnetic field for NMR measurements, a sample tube placed within the static magnetic field and holding a deuterated solvent therein, and a microchip reactor inserted inside the sample tube. A sample solution to be investigated is introduced into the channel formed in the microchip reactor while the microchip reactor is inserted inside the sample tube holding the deuterated solvent therein.

11 Claims, 10 Drawing Sheets

AUTO SAMPLE CHANGER

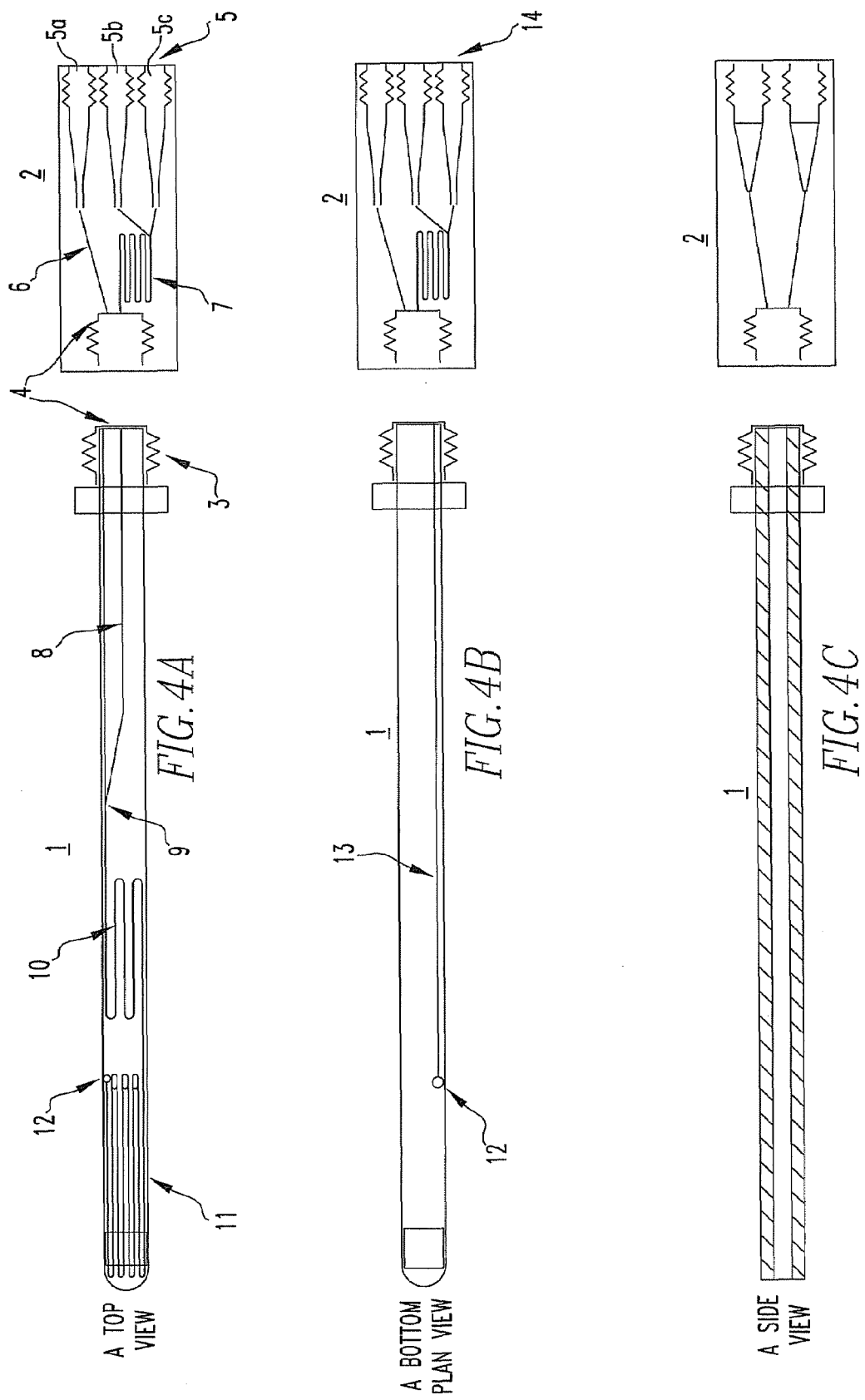

A TOP VIEW

A BOTTOM PLAN VIEW

A SIDE VIEW

A TOP VIEW

A BOTTOM PLAN VIEW

NMR SPECTROMETER AND METHOD OF NMR MEASUREMENT

BACKGROUND OF THE INVENTION

1. Field of the Invention

The present invention relates to an NMR spectrometer and method of NMR measurement and, more particularly, to an NMR spectrometer and method of NMR measurement which can save the amount of deuterated solvent used for NMR locking and which makes it unnecessary to readjust the resolution whenever the sample is exchanged.

2. Description of Related Art

An NMR spectrometer is an instrument producing a static magnetic field in which a sample to be investigated is placed. An RF (radio-frequency) magnetic field orthogonal to the static magnetic field is applied to the sample. Then, a very weak RF magnetic field signal (NMR signal) emanating from the sample is detected. Information about the molecular structure of the sample is extracted from the signal, and the molecular structure of the sample is analyzed.

When an NMR measurement is performed, it is necessary to detect the chemical shift on the order of ppm and thus drift in the static magnetic field is corrected by a technique known as "NMR lock" during the measurement to prevent the drift in the static field. NMR lock is a technique for correcting drift in the static magnetic field by observing an NMR signal arising from a nucleus other than the nucleus under observation (usually, deuterium nucleus ($^2$D)), detecting the amount of shift of the position of the NMR signal originated from the deuterium nucleus due to drift in the static magnetic field, and feeding back a signal corresponding to the shift to the shim coil current used to superimpose a correcting magnetic field on the static magnetic field. Accordingly, in NMR measurement, a deuterium compound (usually, deuterated solvent) is added to the sample to perform NMR locking.

Furthermore, in NMR measurements, the resolution is deteriorated due to inhomogeneity of the strength of the static magnetic field generally caused by the magnetic susceptibility of the sample. Accordingly, whenever a sample is exchanged, the shims are finely adjusted to correct for the inhomogeneity of the static magnetic field strength according to the sample.

PRIOR ART

Japanese Utility Model Laid-Open No. 1982-75558; and Published Technical Report 2004-502547 of Japan Institute of Invention and Innovation.

The problem with the NMR locking is that an expensive deuterated compound must be used in large amounts. In an attempt to solve this problem, a coaxial sample tube has been devised. As shown in FIG. 1, the inside of this tube is composed of an outer tube and an inner tube. That is, a double tube structure is adopted. In use, a sample is inserted in one of the tubes, while a deuterated compound is inserted in the other. According to this method, it is not necessary to mix the sample and deuterated compound. Consequently, the expensive deuterated compound can be reused. The measurement costs can be suppressed. However, when the sample is exchanged, the coaxial sample tube must be inserted and withdrawn. Therefore, there remains the problem that the resolution of the instrument needs to be readjusted whenever an exchange is made.

One method that is effective in reducing labor in making measurements is to use an auto-sample changer for the NMR spectrometer. This changer has a sample tube-holding device over or beside the NMR magnet. Plural NMR sample tubes can be placed in the sample tube-holding device. The changer can insert and withdraw sample tubes into and from the measuring portion of the NMR instrument to perform successive measurements. In this method, however, sample tubes must be inserted and withdrawn during exchange of the sample. Therefore, there is the problem that the resolution of the instrument needs to be readjusted whenever the sample is exchanged. Furthermore, it is necessary to add a deuterated compound to every sample tube for NMR locking. Hence, there is the problem that exorbitant operating costs are necessary.

Furthermore, there is a method of measurement using a flow NMR probe coping with continuous delivery of liquid as shown in FIG. 3. In this method, an autosampler as used in a liquid chromatograph is employed. With this method, it is not necessary to insert and withdraw sample tubes. Therefore, the resolution of the instrument needs to be adjusted only once at first. However, there is the problem that a large amount of deuterated solvent is necessary for NMR locking and cleaning. In addition, expensive dedicated probes are required.

SUMMARY OF THE INVENTION

In view of the foregoing, it is an object of the present invention to provide an NMR spectrometer which can save the amount of deuterated solvent used for NMR locking and which makes it unnecessary to readjust the resolution whenever the sample is exchanged. It is another object of the present invention to provide a method of NMR measurement implemented with this NMR spectrometer.

An NMR spectrometer according to one embodiment of the present invention achieves the first-mentioned object and has a magnet for producing a static magnetic field for NMR measurements, a sample tube placed within the static magnetic field produced by the magnet and holding a deuterated solvent therein, and a microchip inserted inside the sample tube. The microchip includes an introduction portion for introducing plural reagents from plural channels and a reaction portion disconnectably connected with the introduction portion and acting to cause a reagent or a reaction liquid introduced from the introduction portion to mix and react with another reagent. The introduction portion has an introduction channel for introducing a reagent introduced from the outside into the reaction portion and a discharge channel for permitting the reaction liquid discharged from the reaction portion to be discharged to the outside. The reaction portion has (i) a reaction channel in communication with the introduction channel and acting to cause plural reagents pumped from the introduction channel to be mixed and reacted with each other and (ii) a discharge passage for connecting the reaction channel and the discharge channel with each other to return the reaction liquid produced in the reaction channel to the introduction portion.

In one feature of the present invention, the introduction portion is a microchip having a substrate made of a chemically-resistant resin and microchannels formed in the substrate.

In another feature of the present invention, holes for introducing reagents and a hole for discharging the reaction liquid are formed in the same side surface of the introduction portion.

In a further feature of the present invention, the reaction portion is a microchip reactor having a substrate of glass or quartz and microchannels formed in the substrate.

A method of NMR measurement according to one embodiment of the present invention is implemented by an NMR spectrometer having a magnet for producing a static magnetic field for NMR measurements, a sample tube placed in a vertical bore formed in the magnet and holding a deuterated solvent therein, and a microchip inserted inside the sample tube. The method of NMR measurement consists of introducing a sample solution to be investigated into channels in the microchip while the microchip is inserted inside the sample tube holding the deuterated solvent therein.

In one feature of this method, the sample solution is investigated by NMR spectroscopy while the flow is stopped.

In another feature of this method, the sample solution is investigated by NMR spectroscopy without stopping the flow.

In a further feature of this method, the sample solution is delivered by a syringe pump or pipette.

In yet another feature of this method, the sample solution is forcibly injected by a manual injector into the flow of a solvent pumped by a syringe pump, an HPLC pump, or a pipette.

In an additional feature of this method, the sample solution is forcibly injected by an HPLC autosampler into the flow of solvent pumped by an HPLC pump.

In the NMR spectrometer constructed according to one embodiment of the present invention as described above, the amount of deuterated solvent used for NMR locking can be saved. Furthermore, whenever the sample is exchanged, it is not necessary to readjust the resolution.

In the method of NMR measurement according to one embodiment of the present invention as described above, the sample solution is introduced into the channel in the microchip reactor while the microchip reactor is inserted inside the sample tube holding the deuterated solvent therein. Consequently, the amount of deuterated solvent used for NMR locking can be saved. In addition, whenever the sample is exchanged, it is not necessary to readjust the resolution.

Other objects and features of the invention will appear in the course of the description thereof, which follows.

BRIEF DESCRIPTION OF THE DRAWINGS

FIGS. 4A, 4B and 4C are top, bottom and side views of a microchip reactor according to one embodiment of the present invention;

DESCRIPTION OF THE PREFERRED EMBODIMENTS

Figure 1:
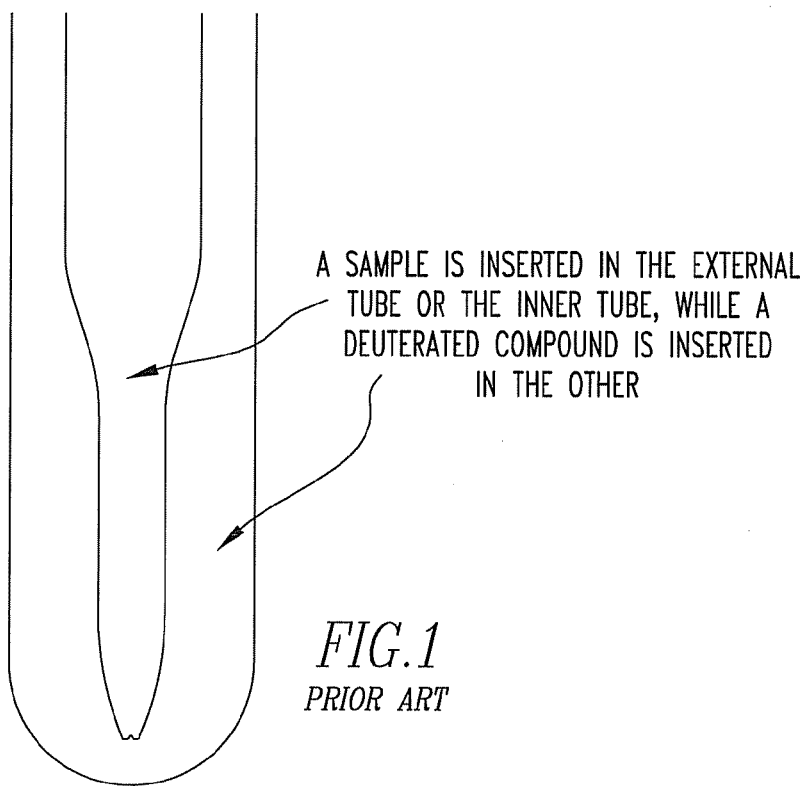
FIG. 1 is a schematic vertical cross section of a prior art coaxial sample tube.
Figure 2:
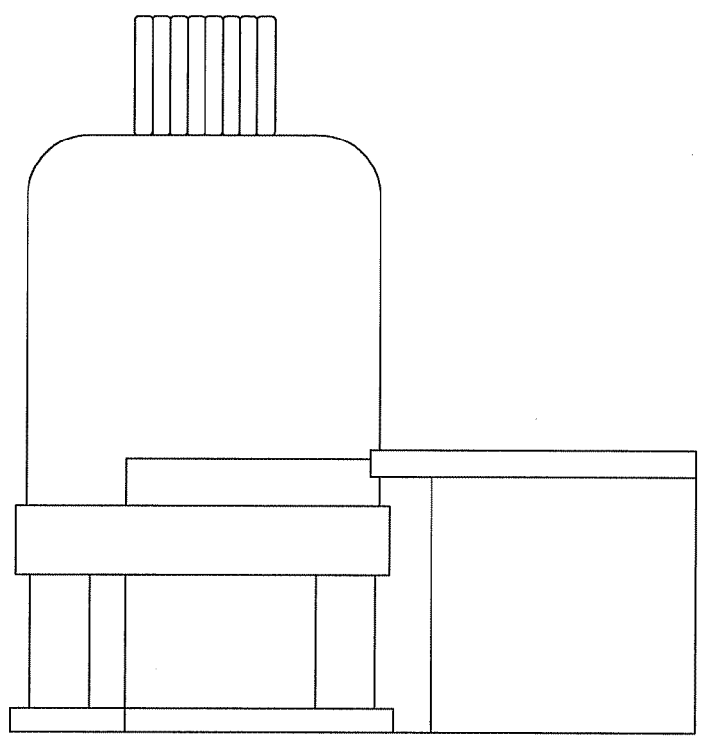
FIG. 2 is a schematic view of a prior art NMR auto-sample changer.
Figure 3:
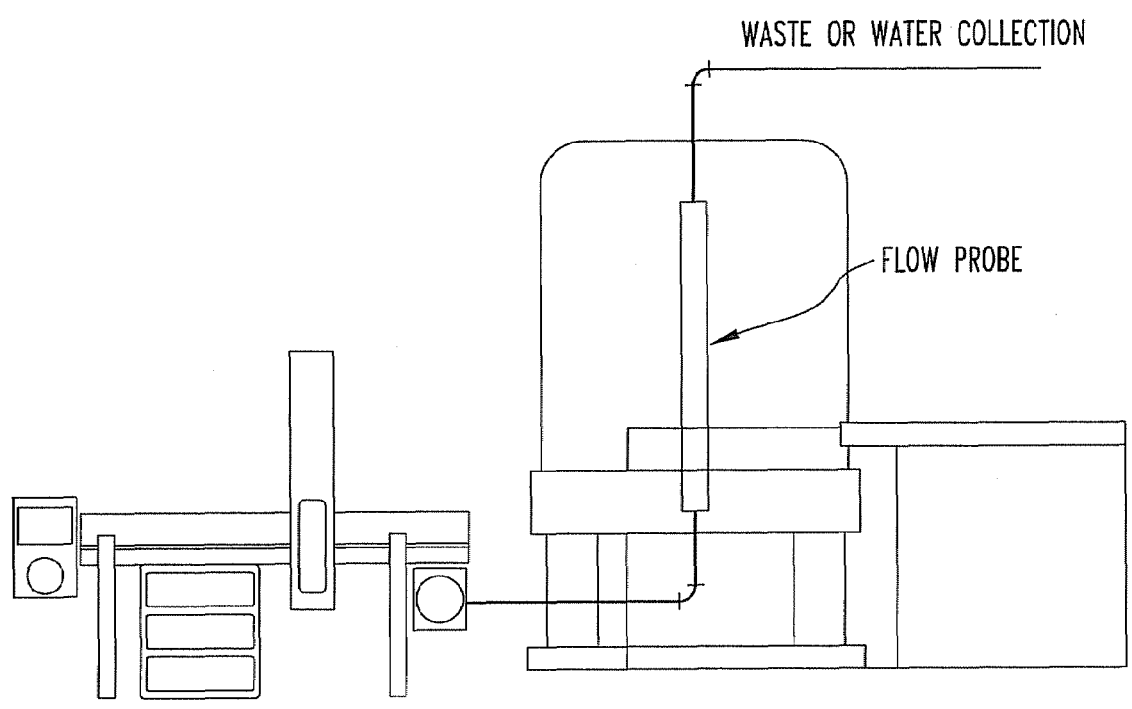
FIG. 3 is a schematic side elevation of a prior art flow NMR probe.

Embodiments of the present invention are hereinafter described with reference to the drawings.

Embodiment 1

A microchip reactor used in the present invention is shown in FIGS. 4A, 4B and 4C. The microchip reactor has a reagent inlet-reaction portion 2 and an extensional reaction portion 1 which have their respective contact portions 4 connected with each other via a connection jig 3.

The extensional reaction portion 1 is fabricated by preparing a glass plate or sheet having a thickness of 1 to 5 mm, forming microchannels in both surfaces of the glass plate by wet etching or drilling, and forming a through-hole 12 from the microchannel in the front surface to the microchannel in the rear surface. The through-hole 12 permits a reagent solution to flow therethrough.

The microchannels are 50 to 500 µm in width and depth. The design of the microchannels and the method of machining or processing them can be modified according to the purpose of use.

Then, the glass plates having the microchannels therein are held between two other glass plates. All the glass plates are bonded together by thermocompression. The glass plate assembly is finished cylindrically by cutting or other technique. Alternatively, a semi-cylindrically formed glass plate may be prepared and microchannels may be formed in the glass plate. Preferably, the diameter of the cylinder is 2 to 10 mm.

The reagent inlet-reaction portion 2 is threaded for connection with tubes. The reagent inlet-reaction portion 2 is also processed or machined to form the microchannels. When the extensional reaction portion 1 and the reagent inlet-reaction portion 2 are connected together, their channel positions meet and thus a reagent solution can be passed through this assembly.

The connection jig 3 has guiding portions to facilitate aligning the extensional reaction portion 1 and the reagent inlet-reaction portion 2. The contact portions 4 are surface-treated or used in combination with a sealant to prevent liquid leakage.

The reagent inlet-reaction portion 2 is provided with three reagent inlet holes 5a, 5b and 5c. Two of these three inlet holes 5b, 5c meet each other to form one channelway at a location immediately ahead of a first reaction portion 7 formed in the reagent inlet-reaction portion 2. This channelway extends through the bent (winding) channel in the first reaction portion 7. In the first reaction portion 7, a first reaction between reagents is induced. The channelway is in communication with a first reaction liquid channel 8 formed in the extensional reaction portion 1.

A channel 6 formed in the reagent inlet portion extends from the remaining one reagent inlet hole 5a and meets the first reaction liquid channel 8 in a second reaction-mixing portion 9 formed in the extensional reaction portion 1 to form one flow passage in communication with a bent (winding) channel formed in a second reaction portion 10. In this second reaction portion 10, a second reaction between the reagents is induced.

The second reaction portion 10 is further in communication with a detector portion channel 11 that is a bent (winding) channel. The channel 11 is connected with the vertically formed through-hole 12, which extends to the rear side of the extensional reaction portion 1 and is connected with a reaction liquid discharge channel 13. This discharge channel 13 is in communication with a reaction liquid discharge hole 14.

Where a single sample is investigated, two of the three reagent inlet holes are plugged. A sample solution is introduced from the third reagent inlet hole and used.

The three reagent inlet holes 5a, 5b and 5c and reaction liquid discharge hole 14 are formed in the same side surface of the reagent inlet-reaction portion 2.

In this way, in the present embodiment, the microchannels in the microchip are formed in the upper and lower surfaces of the reagent inlet-reaction portion 2 and extensional reaction portion 1. That is, two layers of channels are formed.

Preferably, the material of the microchip can be used over a temperature range from −70° C. to +200° C. To permit mass production using molding, the reagent inlet-reaction portion 2 is preferably made of a chemically-resistant resin (such as polyether ether ketone resin (PEEK), Teflon® or Diflon). Preferably, the extensional reaction portion 1 is made of glass or quartz.

Where a reagent having a high viscosity is used, the channel inside the reagent inlet-reaction portion 2 tends to be especially easily clogged up. Therefore, this portion is made external to the extensional reaction portion 1 and replaceable. Consequently, when the instrument is used, the operating costs will be reduced.

Embodiment 2

Figure 5A:
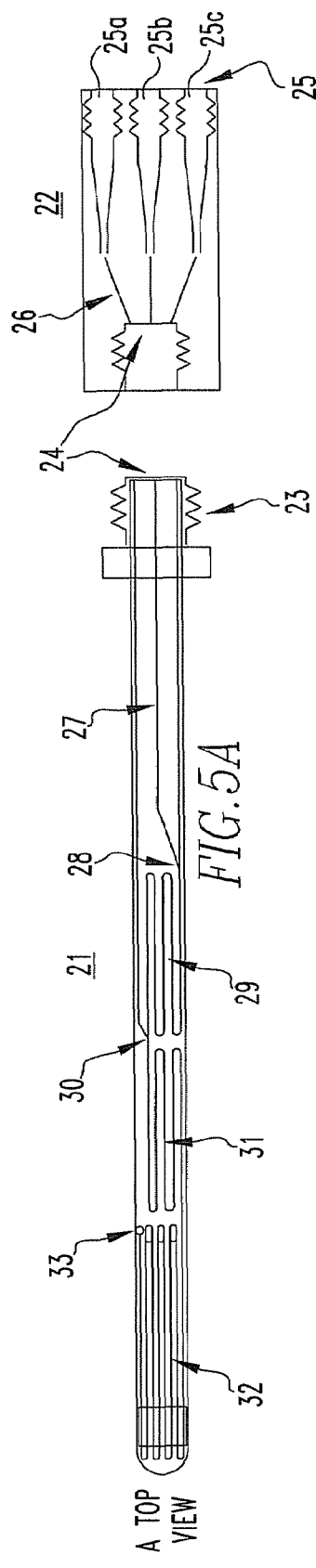
FIGS. 5A, 5B and 5C are top, bottom and side views of a microchip reactor according to another embodiment of the present invention.
Figure 5B:
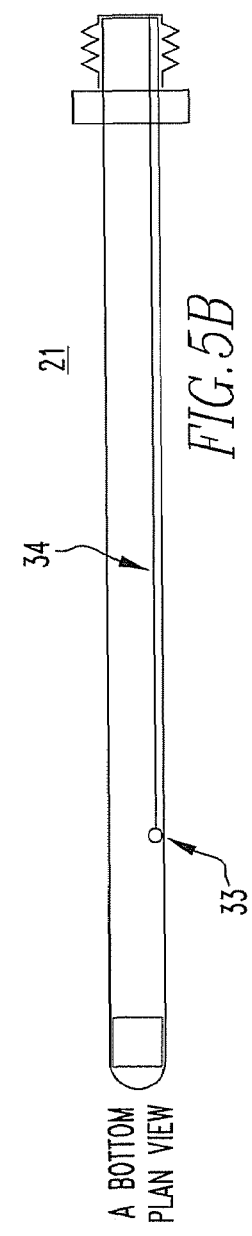
Figure 5C:
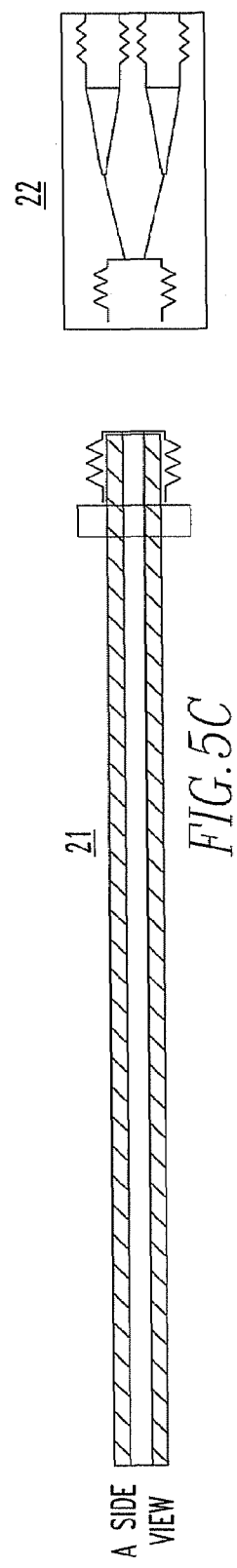

FIGS. 5A, 5B and 5C show another microchip reactor used in the present invention. The microchip reactor has a reagent inlet portion 22 and a reagent reaction portion 21 which are connected with each other in their respective contact portions 24 via a connection jig 23.

The reagent reaction portion 21 has a glass plate or sheet having a thickness of 1 to 5 mm and microchannels formed in the surfaces of the glass plate by wet etching or drilling. The glass plate is provided with a through-hole 33 extending from the microchannel in the front surface to the microchannel in the rear surface. The through-hole 33 permits a reagent solution to flow through the passageway extending from the channel in the front surface to the channel in the rear surface.

The microchannels are 50 to 500 μm in width and depth. The design of the microchannels and method of processing or machining them can be varied according to the purpose of use.

Then, the glass plate having the microchannels is held between two other glass plates. The glass plates are bonded together by thermocompression. The glass plate assembly is finished semi-cylindrically by a cutting technique. Alternatively, a semi-cylindrically formed glass plate may be prepared, and the microchannels may be formed in the glass plate. Preferably, the diameter of the cylinder is 2 to 10 mm.

The reagent inlet portion 22 is threaded for connection with tubes. The reagent inlet portion 22 is also processed or machined to form the microchannels. When the reagent reaction portion 21 and the reagent inlet portion 22 are connected together, their channel positions meet and thus a reagent solution can be passed through this assembly.

The connection jig 23 has guiding portions to facilitate aligning the reagent reaction portion 21 and the reagent inlet portion 22. The contact portions 24 are surface treated or used in combination with a sealant to prevent liquid leakage.

The reagent inlet portion 22 is provided with three reagent inlet holes 25a, 25b and 25c in communication with three reaction liquid channels 26 formed in the reagent reaction portion 21. Two of these three inlet holes 25a, 25b, 25c meet each other in a first reaction-mixing portion 28 to form one channelway in communication with the bent (winding) channel in the first reaction portion 29. In this bent (winding) channel, a first reaction between reagents is induced. The bent (winding) channel in the first reaction portion 29 meets another reaction liquid channel 27 in a second reaction-mixing portion 30 to thereby form one flow channel in communication with the bent (winding) channel in the second reaction portion 31, where a second reaction between the reagents is induced.

The bent (winding) channel in the second reaction portion 31 is in communication with the bent (winding) channel in the detector portion channel 32 and also with a through-hole 33 formed vertically. The through-hole 33 extends to the rear side of the reagent reaction portion 21, which, in turn, is connected with a reaction liquid discharge hole 35 through a reaction liquid discharge channel 34.

Where a single sample is investigated, two of the three reagent inlet holes are plugged. A sample solution is introduced from the third reagent inlet hole and used.

The three reagent inlet holes 25a, 25b, 25c and reaction liquid discharge hole 35 are formed in the same side surface of the reagent inlet portion 22.

In this way, in the present embodiment, the microchannels in the microchip are formed in the upper and lower surfaces of the reagent inlet portion 22 and reagent reaction portion 21. That is, two layers of channels are formed.

Preferably, the material of the microchip can be used over a temperature range from −70° C. to +200° C. To permit mass production using molding, the reagent inlet portion 22 is preferably made of a chemically-resistant resin (such as polyether ether ketone resin (PEEK), Teflon® or Diflon). Preferably, the reagent reaction portion 21 is made of glass or quartz.

Where a reagent having a high viscosity is used, the channel inside the reagent inlet portion 22 tends to be especially easily clogged up. Therefore, this portion is made external to the reagent reaction portion 21 and replaceable. Consequently, when the instrument is used, the operating costs will be reduced.

Embodiment 3

Figure 6A:
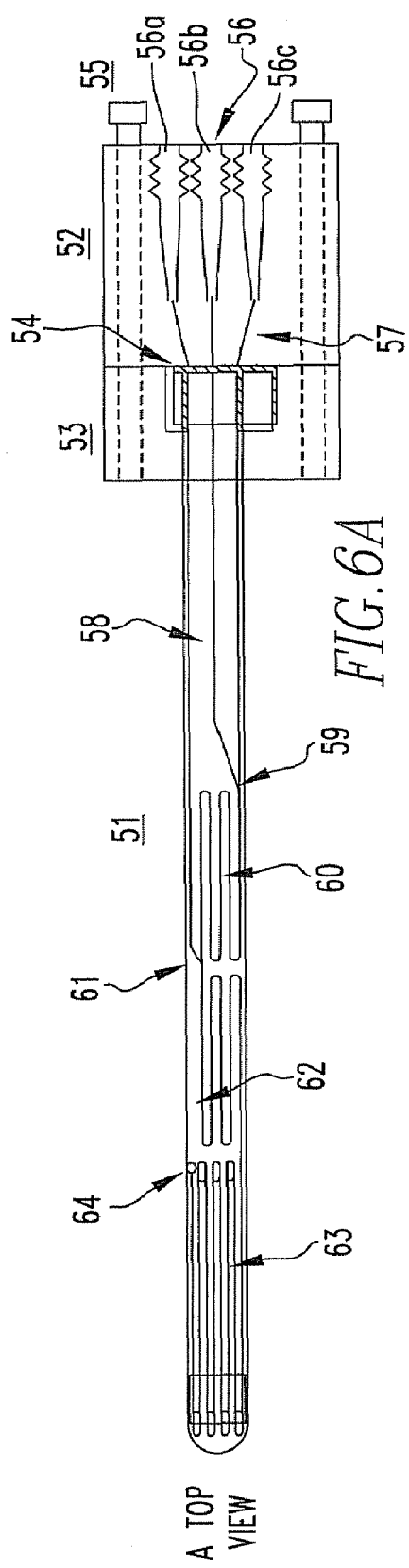
FIGS. 6A and 6B are top and bottom views of a microchip reactor according to a further embodiment of the present invention.
Figure 6B:
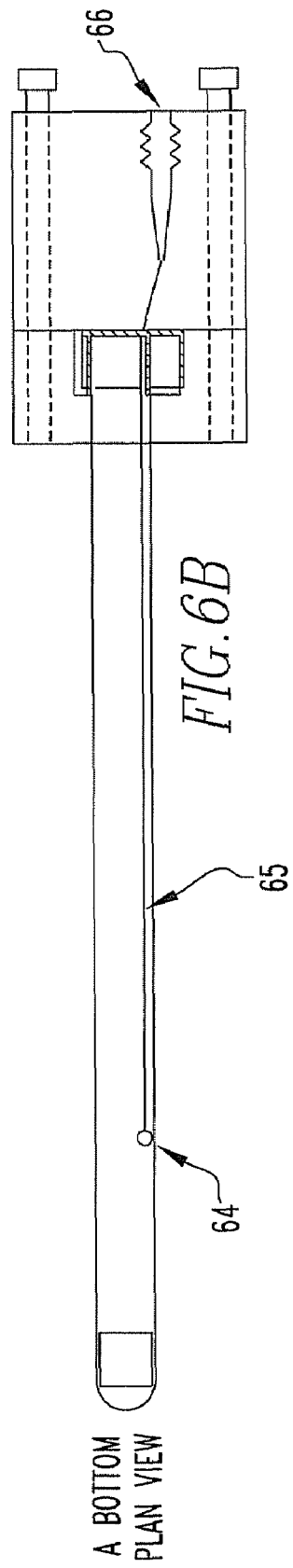

FIGS. 6A and 6B show a further microchip reactor used in the present invention. The microchip reactor has a reagent inlet portion 52 and a reagent reaction portion 51 which are connected with each other in their respective contact portions 54 via a connection jig 53 using screws 55.

The reagent reaction portion 51 has a glass plate or sheet having a thickness of 1 to 5 mm and microchannels formed in the surfaces of the glass plate by wet etching or drilling. The glass plate is provided with a through-hole 64 extending from the microchannel in the front surface to the microchannel in the rear surface. The through-hole 64 permits a reagent solution to flow from the channel in the front surface to the channel in the rear surface.

The microchannels are 50 to 500 μm in width and depth. The design of the microchannels and method of processing or machining them can be varied according to the purpose of use.

Then, the glass plates having the microchannels are held between two other glass plates. All the glass plates are bonded together by thermocompression. The glass plate assembly is cut into an elongate form having a T-shaped one end. The end portion of the reagent reaction portion 51 is shaped like the letter T to permit the T-shaped portion to be pressed and connected to the reagent inlet portion 52 via the connection jig 53. When the reagent reaction portion 51 and the reagent inlet portion 52 are connected together, the T-shaped end of the reagent reaction portion 51 is made asymmetrical horizontally to prevent the senses of the portions 51 and 52 from being mistaken. The connection jig 53 has an asymmetrical fitting portion to permit the user to recognize the asymmetrical portion.

The reagent inlet portion 52 is threaded for connection with tubes. The reagent inlet portion 52 is also processed or machined to form the microchannels. When the reagent reaction portion 51 and the reagent inlet portion 52 are connected together, their channel positions meet and thus a reagent solution can be passed through this assembly.

The contact portions 54 are surface-treated or used in combination with a sealant to prevent liquid leakage.

The reagent inlet portion 52 is provided with three reagent inlet holes 56a, 56b, 56c which are in communication with three reaction liquid channels 58 formed in the reagent reaction portion 51 via three channels 57 in the reagent inlet portion.

Two of them meet each other in a first reaction-mixing portion 59 to form one channelway in communication with the bent (winding) channel in the first reaction portion 60, where a first reaction between reagents is induced. The bent (winding) channel in the first reaction portion 60 meets another reaction liquid channel in the second reaction-mixing portion 61 to form one flow channel in communication with the bent (winding) channel in the second reaction portion 62, where a second reaction between the reagents is induced.

The bent (winding) channel in the second reaction portion 62 is in communication with the bent (winding) channel in the detector portion channel 63, which, in turn, is connected with a vertically formed through-hole 64. This through-hole 64 extends to the rear side of the second reagent reaction portion 62. The rear side is in communication with the reaction liquid discharge hole 66 through the reaction liquid discharge channel 65.

Where a single sample is investigated, two of the three reagent inlet holes are plugged. A sample solution is introduced from the third reagent inlet hole and used.

The three reagent inlet holes 56a, 56b, 56b and reaction liquid discharge hole 66 are formed in the same side surface of the reagent inlet portion 52.

In this way, in the present embodiment, the microchannels in the microchip are formed in the upper and lower surfaces of the reagent inlet portion 52 and reagent reaction portion 51. That is, two layers of channels are formed.

Preferably, the material of the microchip can be used over a temperature range from $-70°$ C. to $+200°$ C. To permit mass production using molding techniques, the reagent inlet portion 52 is preferably made of a chemically-resistant resin (such as polyether ether ketone resin (PEEK), Teflon® or Diflon). Preferably, the reagent reaction portion 51 is made of glass or quartz.

Where a reagent having a high viscosity is used, the channel inside the reagent inlet portion 52 tends to be especially easily clogged up. Therefore, this portion is made external to the reagent reaction portion 51 and replaceable. Consequently, when the instrument is used, the operating costs will be reduced.

Embodiment 4

Figure 7:
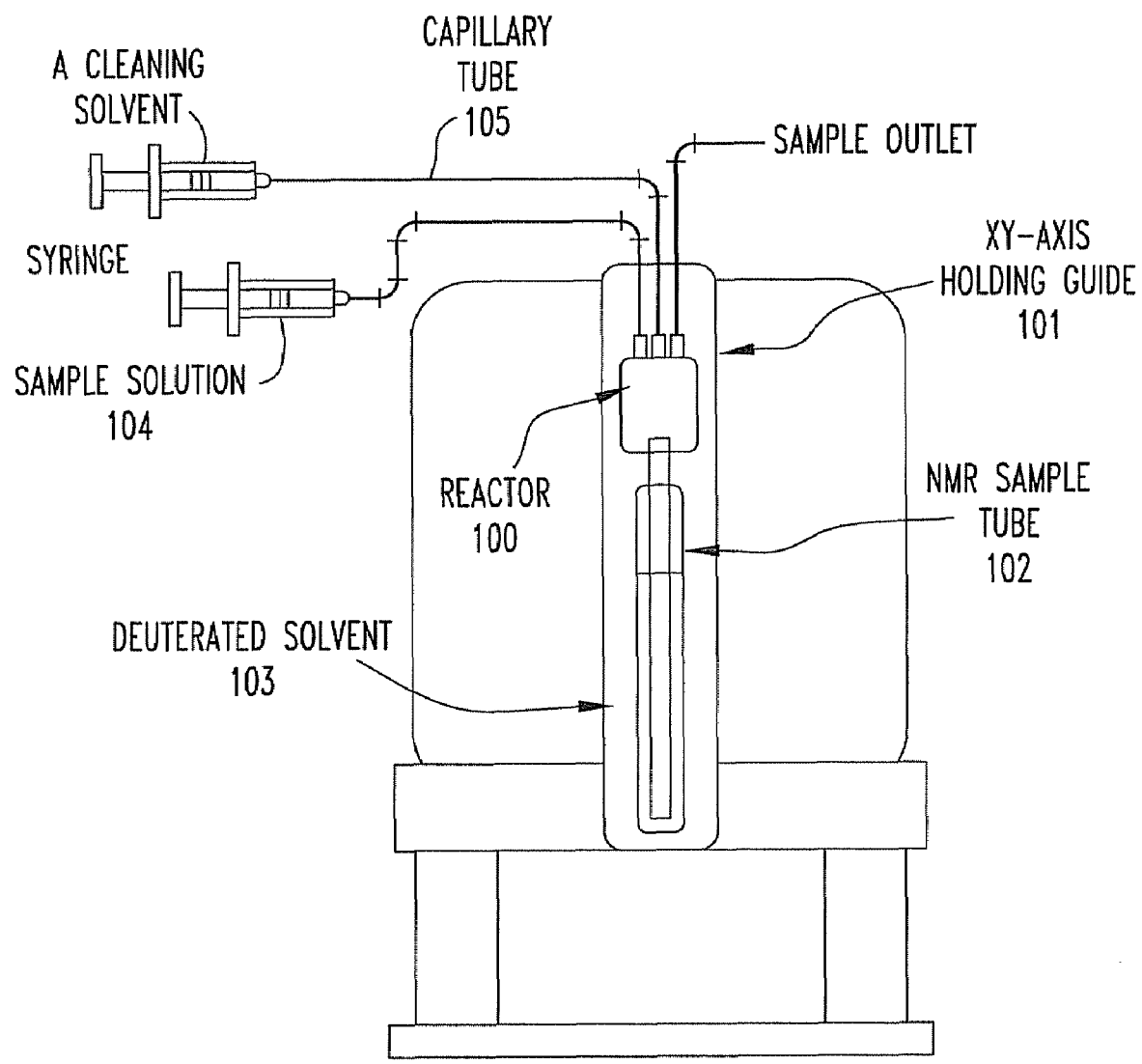
FIG. 7 is a side elevation view partially in cross section of an NMR spectrometer according to a yet other embodiment of the present invention.

FIG. 7 shows an embodiment of the present invention in which such a microchip reactor is installed in an NMR spectrometer. The microchip reactor, indicated by reference numeral 100, is inserted in a vertical bore in a magnet, the bore extending along the Z-axis. The microchip reactor 100 is held by an XY-axis holding guide 101 to prevent the microchip from rotating in the X- and Y-directions. This facilitates adjusting the resolution.

The detector portion of the microchip reactor 100 is inserted in an NMR sample tube 102. A deuterated solvent 103 for NMR locking is injected in the gap between the inner wall of the NMR sample tube 102 and the outer wall of the microchip reactor 100. Because a sample solution 104 flows through the channel inside the microchip reactor 100 and because the deuterated solvent 103 is placed outside the microchip reactor 100, the sample solution 104 and deuterated solvent 103 do not mix. Therefore, as the measurement progresses, it is not necessary to add or exchange the deuterated solvent 103. Consequently, the deuterated solvent 103 can be saved. Furthermore, since the deuterated solvent 103 is prepared independent of the sample solvent 104, it is not necessary to dissolve the sample in the deuterated solvent. For these reasons, the sample can be dissolved in a normal, non-special solvent. Hence, the cost can be curtailed greatly.

Two or more capillary tubes 105 are connected with the microchip reactor 100. A jig that fits a pipette tip or syringe needle is attached to the tip of each capillary tube 105. The sample solution 104 is injected from a pipette or syringe into the microchip reactor 100 placed within the magnet, and an NMR spectrum is measured. In the illustrative example, a syringe is used. The NMR measurement is performed while the flow of the sample solution 104 is at rest.

After the end of the measurement, if successive aliquots of sample solution are injected into the microchip reactor 100 from the syringe by the same method, successive measurements can be performed. Since the sample can be exchanged while the microchip reactor 100 is held within the magnet, if the resolution is once adjusted at first, it is not necessary to readjust the resolution provided that the sample is exchanged, for the following reason. The effect of the magnetic susceptibility that affects the resolution on the static magnetic field is dominated by the glass or quartz material of the microchip reactor 100 and so if the sample solution is exchanged, the resolution is little affected. Diffusion of the sample solution is suppressed within the microchannel formed in the microchip reactor 100. Therefore, according to the present invention, high-resolution NMR spectra can be derived without using spinning.

The microchip reactor 100 has inlet holes capable of introducing plural sample solutions and microchannels connected with the inlet holes. Where the sample solution injected in the microchip reactor 100 is recovered, a cleaning solvent may be injected from an inlet hole different from the inlet hole from which the sample solution was injected.

Embodiment 5

Figure 8:
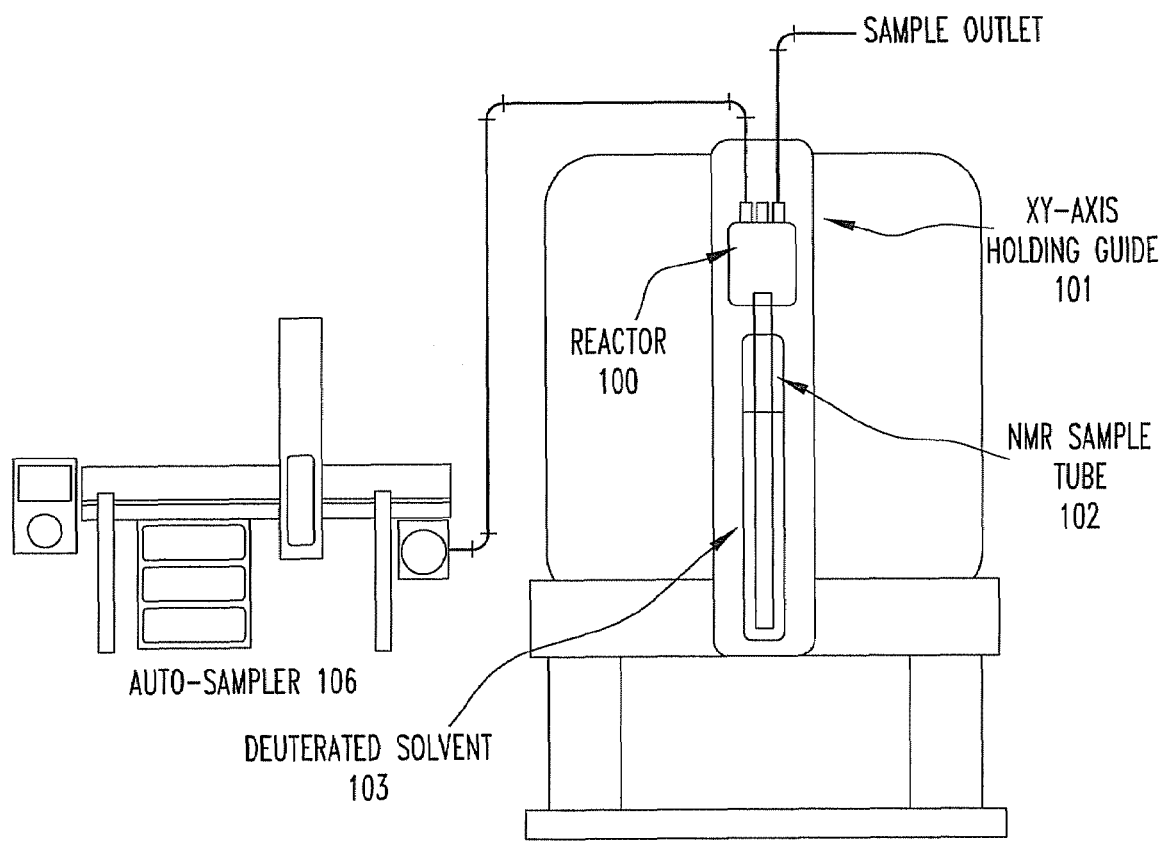
FIG. 8 is a schematic vertical cross section of an NMR spectrometer according to a further embodiment of the present invention.

FIG. 8 shows another embodiment of the present invention in which a microchip reactor is installed in an NMR spectrometer. In this NMR instrument, an autosampler 106 used in high-performance liquid chromatograph (HPLC) is connected with a capillary tube 105 of the microchip reactor 100 instead of a syringe or pipette used for sample loading. Sample is introduced into the microchip reactor automatically and continuously, and NMR spectra are measured. The sample is introduced into the microchip reactor via the capillary tube 105 by a pump ancillary to the autosampler. The pump is stopped to stop the flow of the sample solution once. Then, measurements are performed. Measurements may also be made while introducing a sample without stopping the flow. The measurement timing can be synchronized with sample introduction from the autosampler 106.

Embodiment 6

Figure 9:
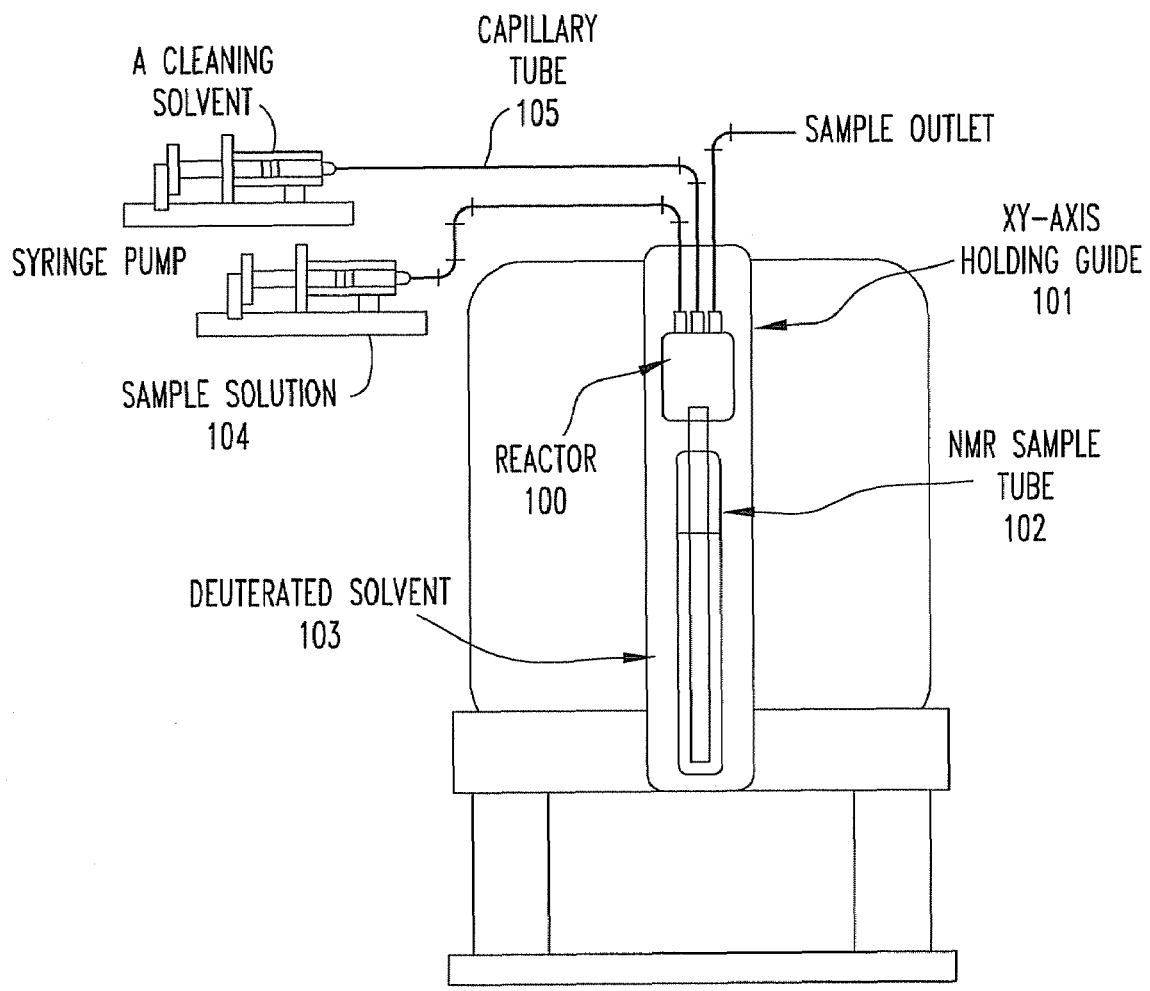
FIG. 9 is a schematic vertical cross section of an NMR spectrometer according to a further embodiment of the present invention.

FIG. 9 shows a modification of Embodiment 4. In the present embodiment, a sample solution is introduced into a microchip reactor 100 using a syringe in the same way as in Embodiment 4. However, NMR spectra are acquired by a flow NMR technique. That is, during the measurement, the flow of the sample solution is not stopped, unlike in Embodiment 4.

Embodiment 7

Figure 10:
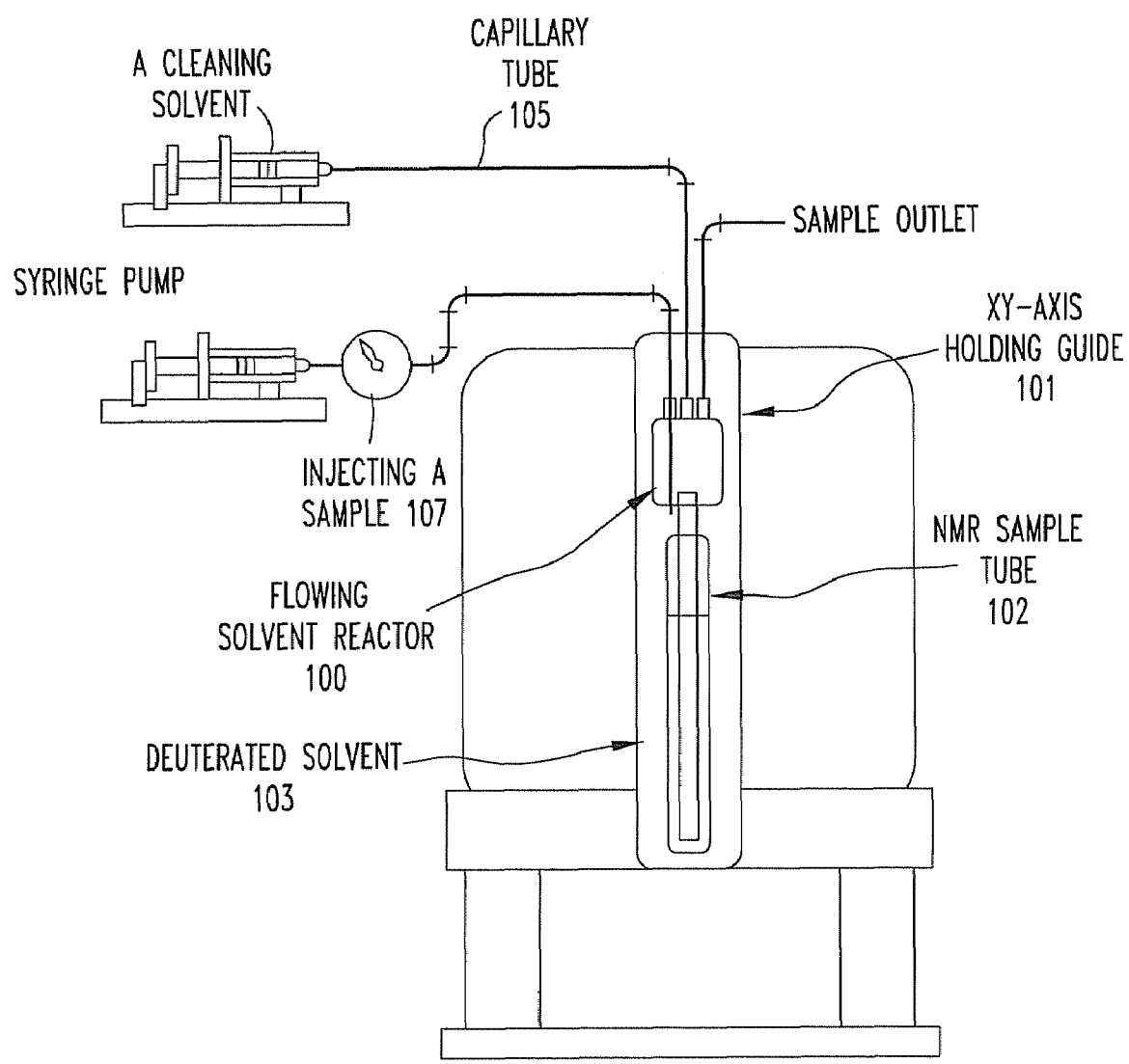
FIG. 10 is a schematic vertical cross section of an NMR spectrometer according to a further embodiment of the present invention.

FIG. 10 shows a modification of Embodiment 6. In the present embodiment, a sample solution is introduced into the microchip reactor 100 using a syringe in the same way as in Embodiment 6. NMR spectra are acquired by a flow NMR technique. That is, during the measurement, the flow of the sample solution is not stopped. However, unlike in Embodiment 6, a manual injector 107 is disposed between the syringe pump and the microchip reactor and connected with the pump and microchip reactor by capillary tubes 105.

An arbitrary solvent (such as methanol or chloroform) is delivered continuously from the syringe pump. A sample solution is forcibly injected from the manual injector 107 into the flow of the solvent. The sample injected from the manual injector 107 is in a segmented state and introduced into the microchip reactor 100, and NMR spectra are measured. The measurement may be so programmed that the measurement is triggered by the injection of the sample from the manual injector 107. If the solvent delivered from the pump and the sample solution is not mixed uniformly, there arises the problem that the resolution is not stable. Therefore, it is important that the tubes in the system have small inside diameters to prevent the sample injected from the manual injector 107 from being diffused.

Embodiment 8

Figure 11:
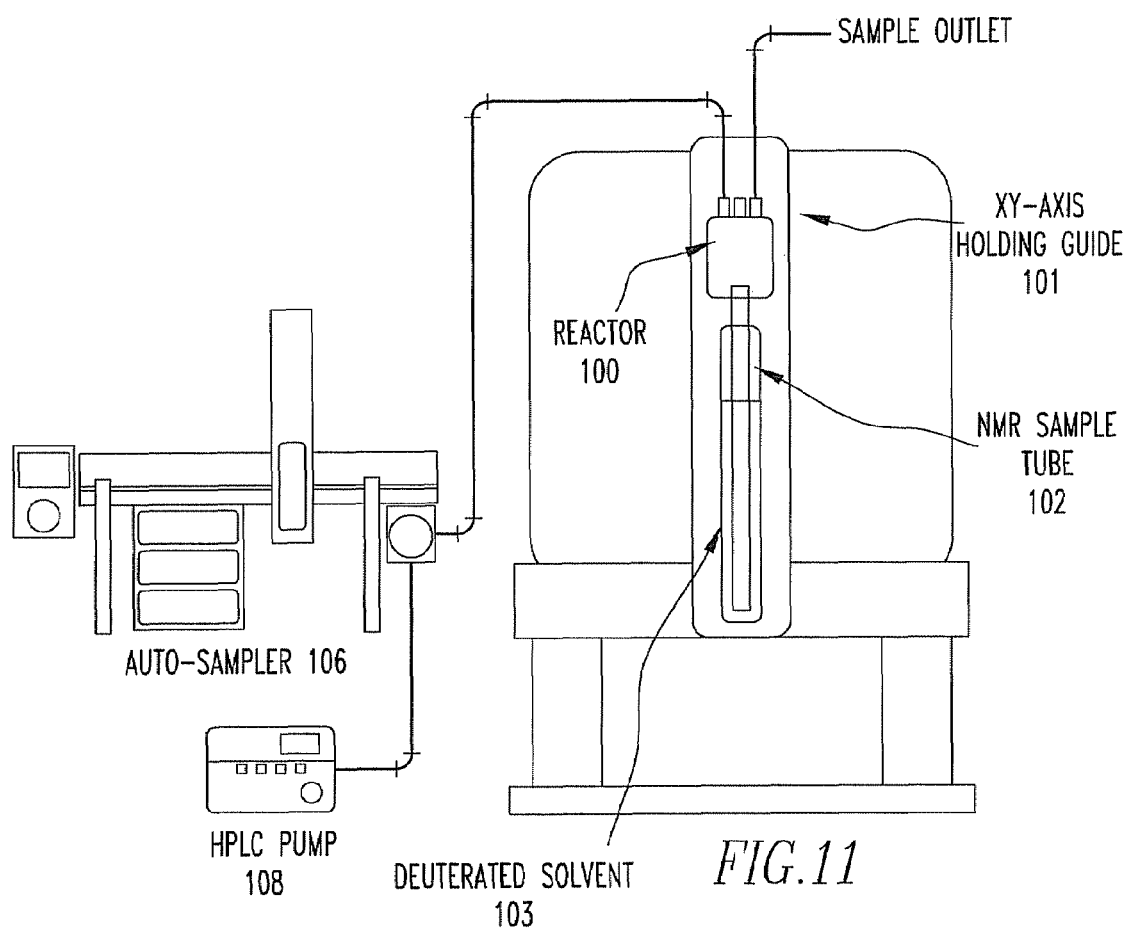
FIG. 11 is a schematic vertical cross section of an NMR spectrometer according to a further embodiment of the present invention.

FIG. 11 shows a modification of Embodiment 5. In the present embodiment, an autosampler 106 is disposed between an HPLC pump 108 and a microchip reactor 100 and connected with the pump and microchip reactor by capillary tubes 105.

An arbitrary solvent (such as methanol or chloroform) is delivered continuously from the HPLC pump 108. A sample solution is forcibly injected from the autosampler 106 into the flow of the solvent. The sample injected from the autosampler 106 is in a segmented state and introduced into the microchip reactor 100, and NMR spectra are measured. The measurement may be so programmed that the measurement is triggered by the injection of the sample from the autosampler 106. If the solvent delivered from the HPLC pump 108 and the sample solution are not mixed uniformly, there arises the problem that the resolution is not stable. Therefore, it is important that the tubes in the system have small inside diameters to prevent the sample injected from the autosampler 106 from being diffused.

The NMR spectrometer and method of NMR measurement according to the present invention can find wide applications in research on organic synthesis and reactions.

Having thus described our invention with the detail and particularity required by the Patent Laws, what is desired protected by Letters Patent is set forth in the following claims.

The invention claimed is:

1. An NMR spectrometer having a magnet for producing a static magnetic field for NMR measurements, a sample tube placed within the static magnetic field produced by the magnet and holding a deuterated solvent therein, and a microchip reactor inserted inside the sample tube, wherein said microchip reactor includes an introduction portion for introducing plural reagents from plural channels and a reaction portion disconnectably connected with the introduction portion and acting to cause a reagent or a reaction liquid introduced from the introduction portion to mix and react with another reagent, wherein said introduction portion has an introduction channel for introducing a reagent introduced from the outside into the reaction portion and a discharge channel for permitting the reaction liquid discharged from the reaction portion to be discharged to the outside, and wherein said reaction portion has (i) a reaction channel in communication with the introduction channel and acting to cause plural reagents pumped from the introduction channel to be mixed and reacted with each other and (ii) a discharge passage for connecting the reaction channel and the discharge channel with each other to return the reaction liquid produced in the reaction channel to the introduction portion.

2. An NMR spectrometer as set forth in claim 1, wherein said introduction portion is a microchip reactor having a substrate of a chemically-resistant resin and a microchannel formed in the substrate.

3. An NMR spectrometer as set forth in claim 1 or 2, wherein inlet holes for introducing reagents and a discharge hole for discharging a reaction liquid are formed in the same side surface of said introduction portion.

4. An NMR spectrometer as set forth in claim 1, wherein said reaction portion is a microchip reactor having a substrate of glass or quartz and a microchannel formed in the substrate.

5. A method of NMR measurement implemented by an NMR spectrometer having a magnet for producing a static magnetic field for NMR measurements, a sample tube placed in a vertical bore formed in the magnet and holding a deuterated solvent therein, and a microchip reactor inserted inside the sample tube, said method of NMR measurement consisting of introducing a sample solution to be investigated into channels in the microchip reactor while the microchip reactor is inserted inside the sample tube holding the deuterated solvent therein.

6. A method of NMR measurement as set forth in claim 5, wherein said sample solution is measured by NMR spectroscopy while stopping flow of the sample solution.

7. A method of NMR measurement as set forth in claim 5, wherein said sample solution is measured by NMR spectroscopy without stopping flow of the sample solution.

8. A method of NMR measurement as set forth in any one of claims 5 to 7, wherein said sample solution is delivered from a syringe pump or pipette.

9. A method of NMR measurement as set forth in claim 8, wherein said sample solution is forcibly injected by a manual injector into flow of the solvent delivered by a syringe pump, HPLC pump, or pipette.

10. A method of NMR measurement as set forth in any one of claims 5 to 7, wherein said sample solution is delivered by an HPLC autosampler.

11. A method of NMR measurement as set forth in claim 10, wherein said sample solution is forcibly injected by the HPLC autosampler into flow of a solvent delivered by an HPLC pump.

* * * * *